United States Patent
Kageyama et al.

(10) Patent No.: US 10,586,712 B2
(45) Date of Patent: Mar. 10, 2020

(54) METHOD OF MANUFACTURING AN ELECTRONIC COMPONENT AND PROCESSING SYSTEM

(71) Applicant: ULVAC, INC., Chigasaki-shi, Kanagawa (JP)

(72) Inventors: Takashi Kageyama, Chigasaki (JP); Tetsuya Shimada, Chigasaki (JP); Koji Takahashi, Chigasaki (JP); Yuu Nakamuta, Chigasaki (JP); Manabu Harada, Chigasaki (JP)

(73) Assignee: ULVAC, INC., Chigasaki-Shi, Kanagawa (JP)

( * ) Notice: Subject to any disclaimer, the term of this patent is extended or adjusted under 35 U.S.C. 154(b) by 0 days.

(21) Appl. No.: 15/755,396

(22) PCT Filed: Aug. 17, 2016

(86) PCT No.: PCT/JP2016/073973
§ 371 (c)(1),
(2) Date: Feb. 26, 2018

(87) PCT Pub. No.: WO2017/033808
PCT Pub. Date: Mar. 2, 2017

(65) Prior Publication Data
US 2018/0254192 A1    Sep. 6, 2018

(30) Foreign Application Priority Data
Aug. 26, 2015    (JP) .................................. 2015-166389

(51) Int. Cl.
*H01L 21/32*    (2006.01)
*H01L 23/29*    (2006.01)
(Continued)

(52) U.S. Cl.
CPC ........ *H01L 21/32* (2013.01); *H01L 21/02362* (2013.01); *H01L 21/56* (2013.01);
(Continued)

(58) Field of Classification Search
None
See application file for complete search history.

(56) References Cited

U.S. PATENT DOCUMENTS

| 2003/0218257 A1 | 11/2003 | Ishio et al. |
| 2005/0104165 A1 | 5/2005 | Ishio et al. |

(Continued)

FOREIGN PATENT DOCUMENTS

| CN | 102194769 A | 9/2011 |
| CN | 102270586 A | 12/2011 |

(Continued)

OTHER PUBLICATIONS

Office Action dated Feb. 13, 2018 in Taiwan Application No. 105127138.
(Continued)

*Primary Examiner* — Moazzam Hossain
*Assistant Examiner* — Stanetta D Isaac
(74) *Attorney, Agent, or Firm* — Saliwanchik, Lloyd & Eisenschenk (57) ABSTRACT

According to a mode of the present invention, a method of manufacturing an electronic component includes: preparing a component main-body 110 including a first surface having an electrode-formed region having a plurality of bump electrodes 103, a second surface opposite to the first surface, and side peripheral surfaces connecting the first surface and the second surface; forming a mask section M1 on at least a peripheral portion of the first surface, the mask section surrounding the electrode-formed region, a height of the mask section being equal to or more than a height of the (Continued)

plurality of bump electrodes; bonding the mask section of the first surface to an adhesive layer 30 on a holder for holding a component; forming a protective film 105 on the component main-body, the protective film covering the second surface and the side peripheral surfaces; and removing the mask section M1 from the first surface.

8 Claims, 10 Drawing Sheets

(51) Int. Cl.
*H01L 23/31* (2006.01)
*H01L 21/56* (2006.01)
*H01L 21/673* (2006.01)
*H01L 21/02* (2006.01)
*H01L 23/00* (2006.01)

(52) U.S. Cl.
CPC .......... *H01L 21/568* (2013.01); *H01L 21/673* (2013.01); *H01L 23/29* (2013.01); *H01L 23/31* (2013.01); *H01L 23/3114* (2013.01); *H01L 23/3157* (2013.01); *H01L 24/17* (2013.01)

(56) References Cited

U.S. PATENT DOCUMENTS

| | | |
|---|---|---|
| 2011/0221046 A1 | 9/2011 | Xiao |
| 2013/0217184 A1 | 8/2013 | Ishizuki et al. |
| 2015/0171021 A1 | 6/2015 | Takano et al. |
| 2016/0205778 A1* | 7/2016 | Lin .................... H01L 24/97 174/264 |

FOREIGN PATENT DOCUMENTS

| | | |
|---|---|---|
| CN | 104752189 A | 7/2015 |
| JP | 2003-347441 A | 12/2003 |
| JP | 2007-329182 A | 12/2007 |
| JP | 2014-175853 A | 9/2014 |
| JP | 2015-115559 A | 6/2015 |
| TW | 2013-49396 A | 12/2013 |

OTHER PUBLICATIONS

International Search Report in International Application No. PCT/JP2016/073973, filed Aug. 17, 2016.
Office Action dated Sep. 29, 2019 in Chinese Application No. 201680038073.7.

* cited by examiner

METHOD OF MANUFACTURING AN ELECTRONIC COMPONENT AND PROCESSING SYSTEM

CROSS-REFERENCE TO RELATED APPLICATIONS

This application is the U.S. national stage application of International Patent Application No. PCT/JP2016/073973, filed Aug. 17, 2016, which claims priority to Japanese Application No. 2015-166389, filed Aug. 26, 2015, the disclosures of each of which are incorporated herein by reference in their entirety.

TECHNICAL FIELD

The present invention relates to a method of manufacturing an electronic component having a protective film and a processing system for manufacturing the electronic component, for example.

BACKGROUND ART

In recent years, electronic devices are downsized and sophisticated. Accordingly, it is also desirable to provide various kinds of further downsized and sophisticated built-in electronic components. To meet such a request, for example, higher-density packages of electronic components are being developed.

Meanwhile, there is widely known a technique in which a workpiece/a plurality of workpieces to be processed is/are mounted on a carrier, and the workpiece/workpieces is/are processed while delivering the carrier for a plurality of steps in sequence. In this case, preferably, the workpiece/workpieces can be held on the carrier and can be detachably attached to the carrier easily at the same time. For example, the following Patent Literature 1 discloses a carrier jig. The carrier jig includes a carrier plate, and an adhesive layer provided on the carrier plate. The carrier jig is configured to detachably and adhesively hold a workpiece on the adhesive layer.

CITATION LIST

Patent Literature

Patent Literature 1: Japanese Patent Application Laid-open No. 2007-329182

DISCLOSURE OF INVENTION

Technical Problem

In order to mount electronic components at a higher density, it is necessary to reduce the space in which each electronic component is mounted. To reduce the space, according to a surface-mount component of the recent trend, a plurality of bump electrodes (bumps) are arrayed in a grid pattern on the bottom surface (mount surface) of a component. Examples of such a surface-mount component include a BGA (Ball Grid Array)/CSP (Chip Size Package), etc.

However, when the above-mentioned carrier including an adhesive layer adhesively holds such an electronic component, the bump electrodes inhibits bonding between the component main-body and the adhesive layer. As a result, the adhesion strength is insufficient, and the electronic component may drop off from the carrier when it is conveyed. Further, when forming a protective film on the front surface of the component main-body, the film-material may spread into the clearance between the component main-body and the adhesive layer, come in contact with the bottom surface of the component main-body, and adhere to the bottom surface. As a result, low-quality bump electrodes may be manufactured.

Meanwhile, for example, if a high-cushioned adhesive layer is used, the bump electrodes are buried into the adhesive layer. As a result, the contact area between the component main-body and the adhesive layer may be large. However, in this case, not only the bump electrodes but also the bottom surface of the component main-body may be buried into the adhesive layer. As a result, the adhesive layer covers the lowermost portions of the side peripheral surfaces of the component main-body. It is difficult to appropriately form a protective film on the lowermost portions of the side peripheral surfaces. Further, when the component is detached from the adhesive layer after forming a film, the protective film formed on the side peripheral surfaces may be peeled off.

In view of the above-mentioned circumstances, it is an object of the present invention to provide a method of manufacturing an electronic component and a processing system capable of inhibiting a film from adhering to bump electrodes and forming the protective film on the entire side peripheral surfaces of a component main-body.

Solution to Problem

To attain the above-mentioned object, according to a mode of the present invention, a method of manufacturing an electronic component includes preparing a component main-body including a first surface having an electrode-formed region having a plurality of bump electrodes, a second surface opposite to the first surface, and side peripheral surfaces connecting the first surface and the second surface.

The method includes forming a mask section on at least a peripheral portion of the first surface, the mask section surrounding the electrode-formed region, a height of the mask section being equal to or more than a height of the plurality of bump electrodes.

The method includes bonding the mask section of the first surface to an adhesive layer on a holder for holding a component.

The method includes forming a protective film on the component main-body, the protective film covering the second surface and the side peripheral surfaces.

The method includes removing the mask section from the first surface.

The method includes forming a mask section on at least a peripheral portion of the first surface of the component main-body, the mask section surrounding the electrode-formed region, a height of the mask section being equal to or more than a height of the plurality of bump electrodes. Therefore, in the step of bonding the component main-body to the holder, the component main-body is bonded to the adhesive sheet without a clearance between the component main-body and the adhesive sheet. In addition, the component main-body is not buried into the adhesive layer, and the component main-body is bonded to the adhesive layer, the flatness being high and the contact area being sufficient. As a result, it is possible to inhibit a film from adhering to bump electrodes and form the protective film on the entire side peripheral surfaces of a component main-body.

The step of forming the mask section may include coating an insulative material or a conductive material on the peripheral portion of the first surface. In this example, the four-cornered annular mask section is formed and surrounds the plurality of bump electrodes in the electrode-formed region of the first surface.

Alternatively, the step of forming the mask section may include coating an insulative material or a conductive material on the peripheral portion and the electrode-formed region of the first surface. In this example, the mask section is formed in a mode of a protective layer that spatially surrounds the plurality of bump electrodes in the electrode-formed region. Further, the contact area between the mask section and the adhesive layer on the holder may be larger. Therefore, the adhesive holding force of adhesively holding the component main-body is increased.

Alternatively, the step of forming the mask section may include bonding a peripheral portion of a deformable film material to the peripheral portion of the first surface, the deformable film material covering the electrode-formed region. In this example, the mask section is formed in a mode of a cover that spatially surrounds the plurality of bump electrodes in the electrode-formed region. Also in this example, the contact area between the mask section and the adhesive layer on the holder may be larger. Therefore, the adhesive holding force of adhesively holding the component main-body is increased.

Typically, in the manufacturing method, a plurality of electronic components are manufactured simultaneously. In other words, the plurality of component main-bodies are bonded to the adhesive layer, and the protective films are formed on the plurality of component main-bodies, respectively, all at once. Therefore, productivity may be increased.

The manufacturing method may further include: peeling the component main-body from the adhesive layer; and then replacing the adhesive layer on the holder. As a result, it is possible to manufacture the electronic components by using the common holder and, at the same time, keep the adhesive holding force of adhesively holding the component main-bodies constant.

Meanwhile, according to a mode of the present invention, a processing system for processing an electronic component including a first surface having an electrode-formed region having a plurality of bump electrodes, a second surface opposite to the first surface, and side peripheral surfaces connecting the first surface and the second surface, includes a mask forming unit, a mount unit, and a film-forming unit.

The mask forming unit is configured to form a mask section on at least a peripheral portion of the first surface, the mask section surrounding the electrode-formed region, a height of the mask section being equal to or more than a height of the plurality of bump electrodes.

The mount unit bonds the mask section of the first surface to an adhesive layer on a holder for holding a component.

The film-forming unit forms a protective film on the second surface and the side peripheral surfaces, the film-forming unit including a film-forming chamber capable of accommodating the holder.

Advantageous Effects of Invention

As described above, according to the present invention, it is possible to inhibit a film from adhering to bump electrodes and form the protective film on the entire side peripheral surfaces of a component main-body.

MODE(S) FOR CARRYING OUT THE INVENTION

Hereinafter, embodiments of the present invention will be described with reference to the drawings.

First Embodiment

Figure 1:
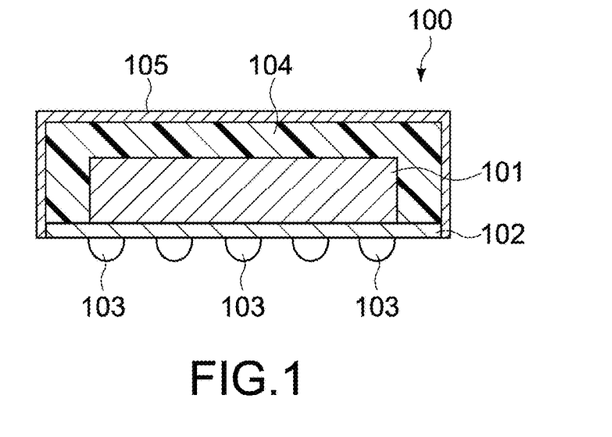
FIG. 1 A side-cross-sectional view schematically showing the configuration of an electronic component to be manufactured.

FIG. 1 is a side-cross-sectional view schematically showing the configuration of the electronic component to be manufactured.

As shown in FIG. 1, the electronic component 100 to be manufactured is a BGA/CSP-type semiconductor package component. The electronic component 100 includes the semiconductor chip 101, the wiring board 102 electrically connected to the semiconductor chip 101, the plurality of bumps (bump electrodes) 103 arrayed in a grid pattern on the back surface of the wiring board 102, the resin body 104 for sealing the semiconductor chip 101, and the protective film 105 that coats the top surface and the side peripheral surfaces of the resin body 104.

Note that FIG. 1 schematically shows the bumps 103 to facilitate understanding. The number, the size, the shape, and the like of the bumps 103 may be different from actual bumps (the same applies to hereinafter).

Figure 2:
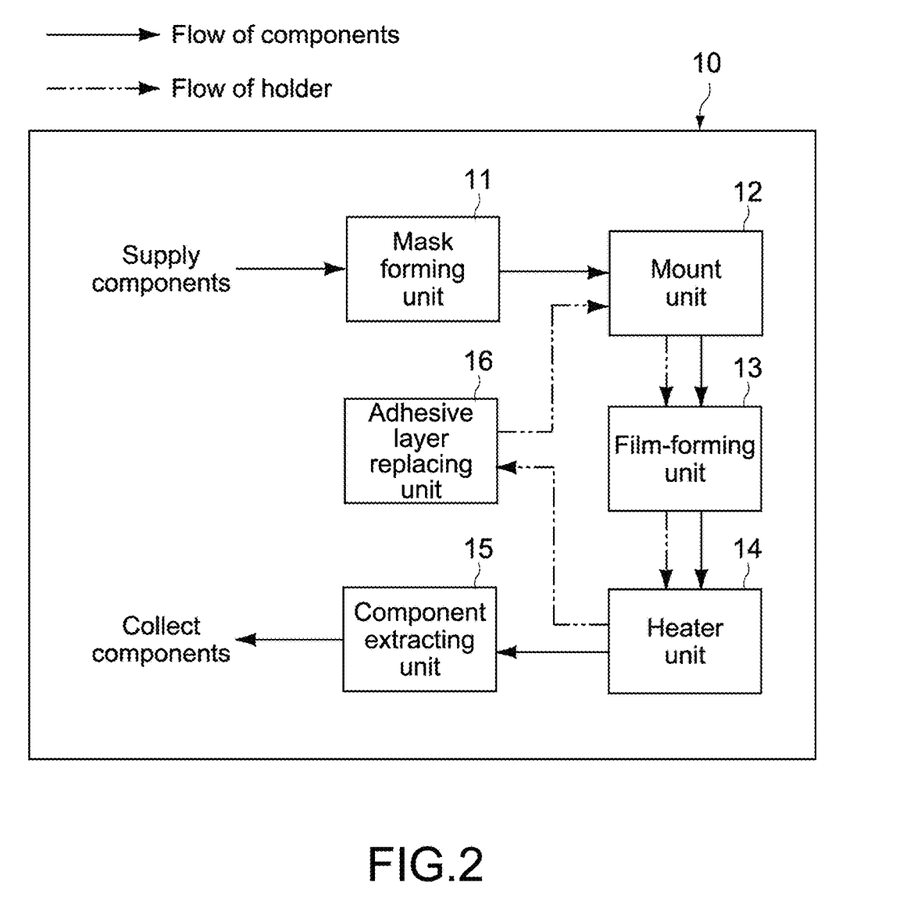
FIG. 2 A block diagram schematically showing the processing system for manufacturing the electronic component.

FIG. 2 is a block diagram schematically showing the processing system 10 for manufacturing the electronic component 100. The processing system 10 is used for forming the protective film 105, which is one of the steps of the method of manufacturing the electronic component 100.

As shown in FIG. 2, the processing system 10 includes the mask forming unit 11, the mount unit 12, the film-forming unit 13, the heater unit 14, the component extracting unit 15, and the adhesive layer replacing unit 16.

Figure 3:
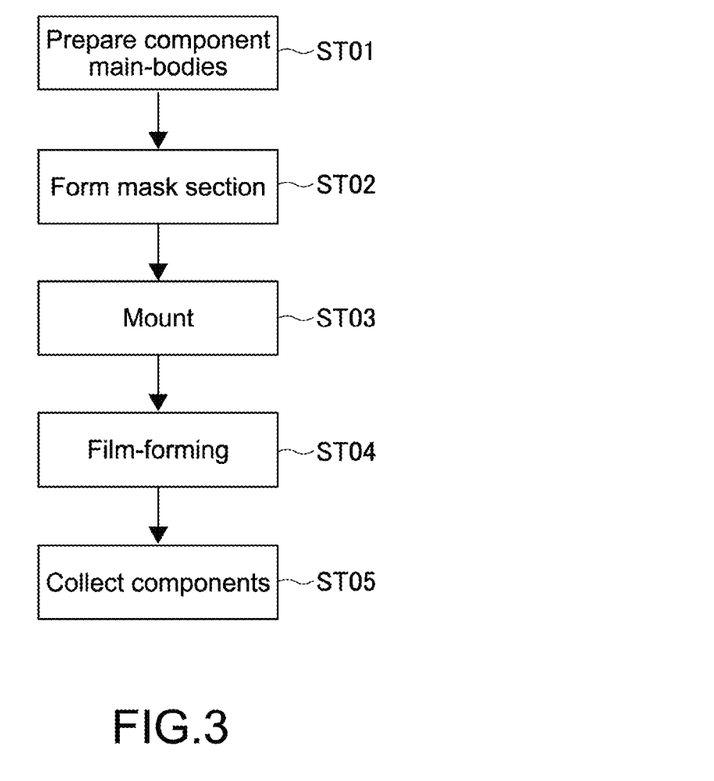
FIG. 3 A flowchart illustrating the method of manufacturing the electronic component using the processing system.

FIG. 3 is a flowchart illustrating the method of manufacturing the electronic component 100 using the processing system 10.

As shown in FIG. 3, the method of manufacturing the electronic component 100 of the present embodiment includes the step of preparing component main-bodies (ST01), the mask section forming step (ST02), the mounting step (ST03), the film-forming step (ST04), and the step of collecting components (ST05).

[Step of Preparing Component Main-Bodies]

Figure 4A:
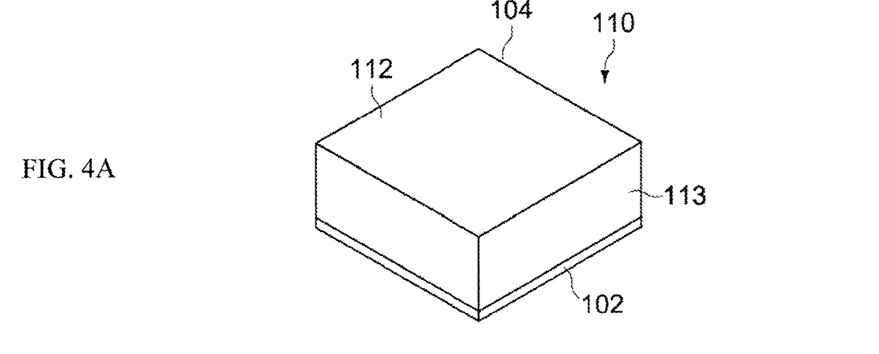
FIGS. 4A through 4C Perspective views and a side view each schematically showing the electronic component (component main-body) before forming a protective film.
Figure 4B:
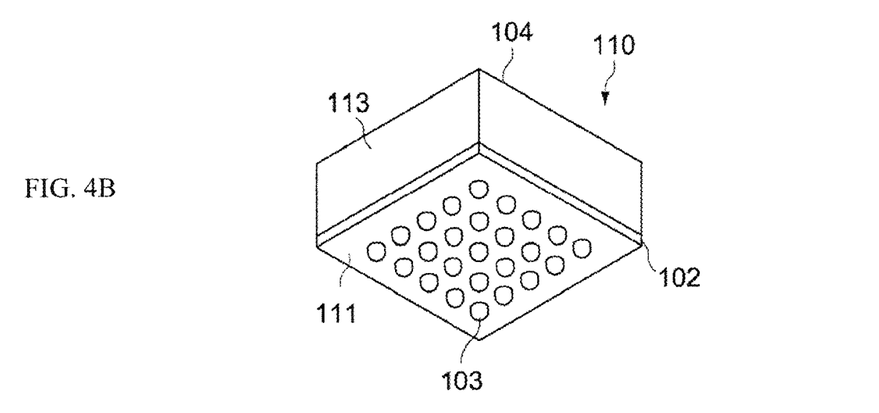
Figure 4C:
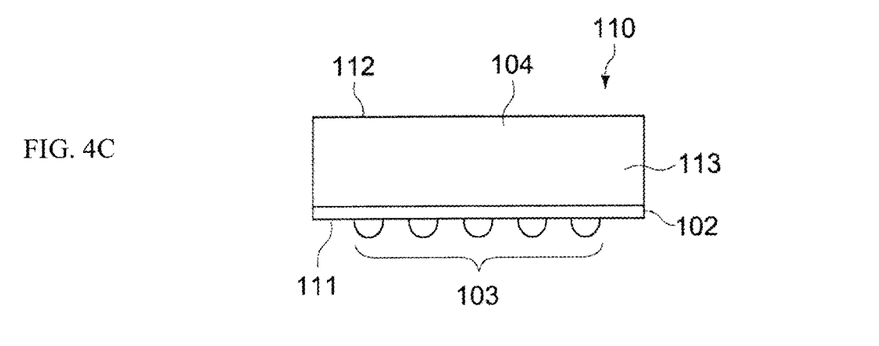

FIGS. 4A through 4C include a top perspective view, a bottom perspective view, and a side view, each of which shows an electronic component on which the protective film 105 is yet to be formed (hereinafter, referred to as the component main-body 110).

As shown in FIGS. 4A through 4C, the component main-body 110 schematically has a rectangular parallelepiped shape. The component main-body 110 includes the bottom surface 111 (first surface) having the plurality of bumps 103, the top surface 112 (second surface) opposite to the bottom surface 111, and the side peripheral surfaces 113 connecting the bottom surface 111 and the top surface 112. The bottom surface 111 corresponds to the back surface of the wiring board 102. The top surface 112 corresponds to the top surface of the resin body 104. The side peripheral surfaces 113 correspond to the four side surfaces of the resin body 104 and the four side surfaces of the wiring board 102.

Typically, such a component main-body 110 is prepared before the step of forming the protective film 105. The component main-body 110 may be manufactured outside or may be a commercial product. The size of the component main-body 110 is also not particularly limited. For example, the component main-body 110 has a plane shape of 3 mm×3 mm to 25 mm×25 mm square.

[Step of Forming Mask Section]

Figure 5:
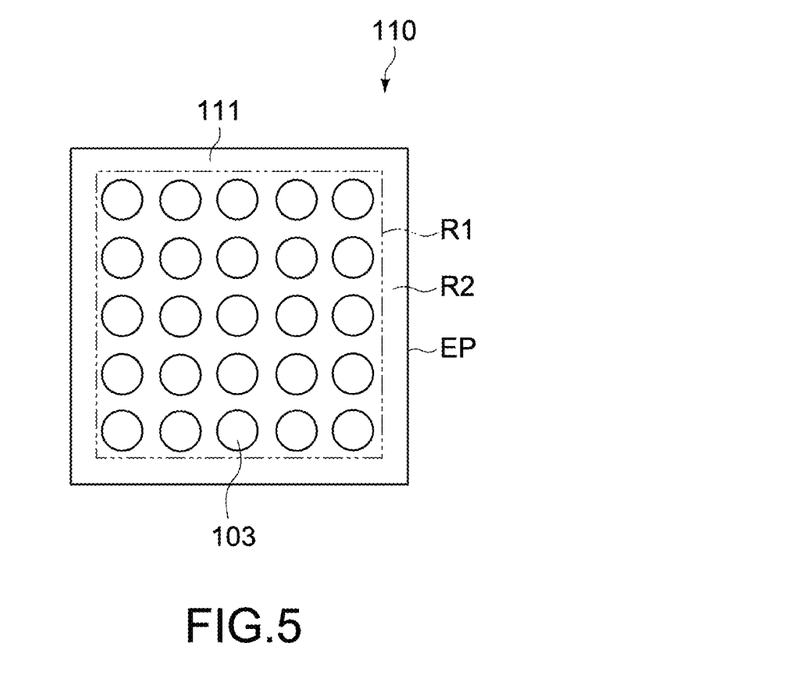
FIG. 5 A bottom view showing the component main-body.
Figure 6:
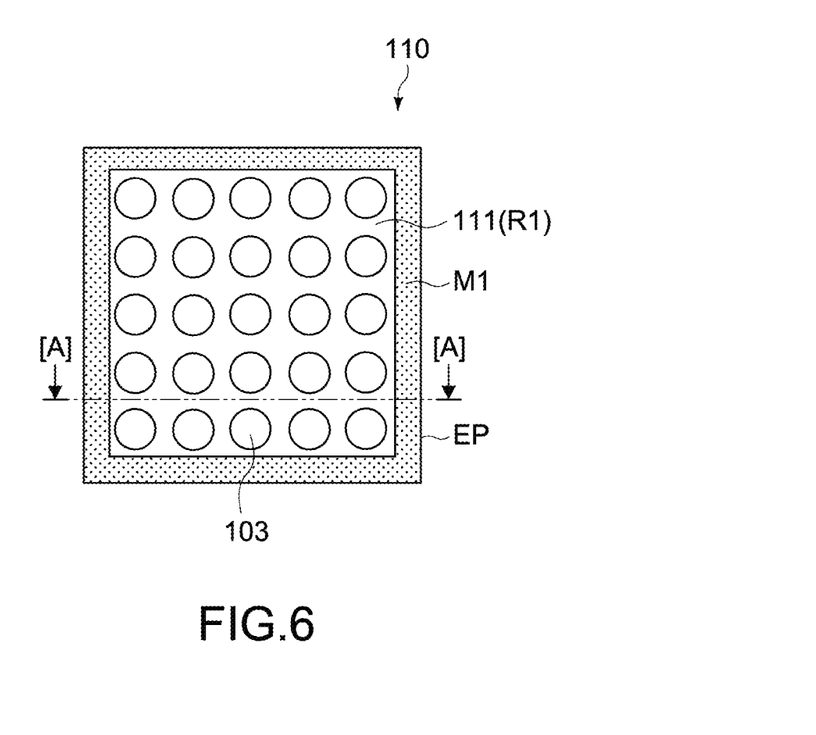
FIG. 6 A bottom view showing the component main-body for illustrating the structure of the mask section of the first embodiment of the present invention.
Figure 7:
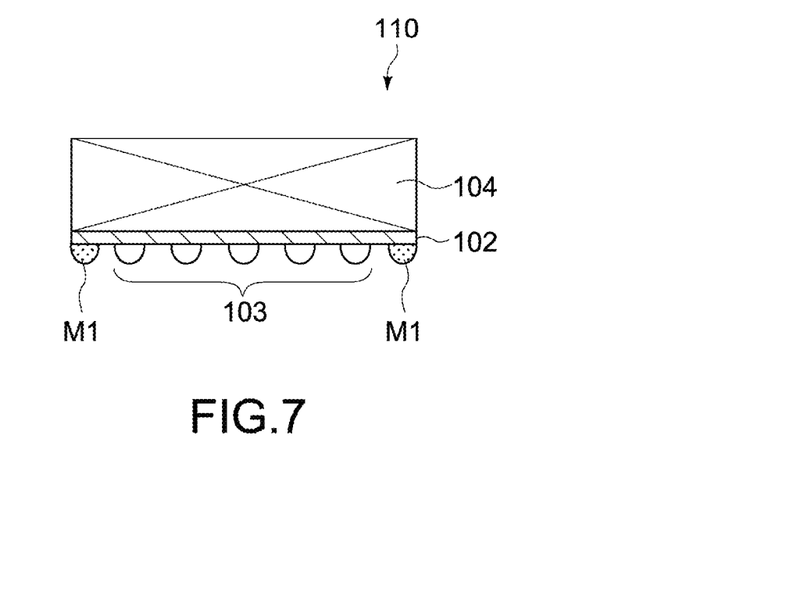
FIG. 7 A side cross-sectional view showing the component main-body.

FIG. 5 is a bottom view showing the component main-body 110. FIG. 6 is a bottom view showing the component main-body 110 on which the mask section M1 is formed, and FIG. 7 is a side cross-sectional view showing that.

In the mask section forming step (ST02), the mask section M1 is formed on the bottom surface 111 of the component main-body 110. The mask section M1 is formed on at least a peripheral portion of the bottom surface 111, and surrounds the electrode-formed region including the plurality of bumps 103. The height of the mask section M1 is equal to or more than the height (for example, 100 μm) of the bumps 103.

As shown in FIG. 5, the bottom surface 111 of the component main-body 110 includes the electrode-formed region R1 including the plurality of bumps 103. The peripheral portion of the bottom surface 111 means the four-cornered annular external peripheral region R2 between the electrode-formed region R1 and the external peripheral portion EP of the bottom surface 111. In the present embodiment, the mask section M1 is formed on the external peripheral region R2 of the bottom surface 111, has a four-cornered annular shape, and surrounds the electrode-formed region R1. Further, as shown in FIG. 7, the mask section M1 formed on the bottom surface 111 of the component main-body 110 has about the height equal to or more than the height of the plurality of bumps 103.

The region in which the mask section M1 is formed is not particularly limited as long as the mask section M1 surrounds the electrode-formed region R1 of the bottom surface 111. FIG. 6 shows merely an example in which the mask section M1 is formed in the external peripheral region R2 entirely. Alternatively, the mask section M1 may be formed in a part of the external peripheral region R2.

The mask section M1 is made of an insulative resin material. Examples of a resin material include silicone resin, epoxy resin, phenol resin, and the like. Such a resin material having heat resistance of 100° C. or more, for example, is used. The curable type of the resin material is not particularly limited. Ultraviolet curable, heat curable, binary-liquid curable, dry curable, or moisture curable resin, or the like is applicable. Above all, ultraviolet curable or moisture curable resin, or the like is advantageous from the viewpoint of productivity.

The method of forming the mask section M1 is also not particularly limited. Typically, a coating method is employed. Instead, a printing method, a transferring method, or the like is applicable. In the present embodiment, the mask section M1 is formed by using a coating method using a dispenser nozzle/dispenser nozzles.

The mask section M1 may be or may not be in contact with the group of the outermost bumps 103 in the electrode-formed region R1. The cross-sectional shape of the mask section M1 is not particularly limited. It may have a round shape as shown in FIG. 7, or may have a rectangular shape or the like. In the present embodiment, because the mask section M1 is formed by using the coating method, the formed mask section M1 has a round shape as shown in FIG. 7 because of the surface tension of paste-type resin material.

The mask forming unit 11 of the processing system 10 executes the step of forming the mask section. The component main-bodies 110 are supplied to the mask forming unit 11. The mask forming unit 11 forms the mask section M1 on each component main-body 110, or forms the mask sections M1 on the plurality of component main-bodies 110 simultaneously.

The mask forming unit 11 includes, for example, a tray capable of positioning and supporting the plurality of component main-bodies 110 such that each bottom surface 111 is the upside, one or more dispenser nozzles that form the mask section M1 on the bottom surface 111 of each component main-body 110 supported by the tray, and the like. After forming the mask sections M1, the component main-bodies 110 supported by the tray are conveyed from the mask forming unit 11 to the mount unit 12. A belt conveyer using a robot and the like may automatically convey the component main-bodies 110, or a worker may carry the component main-bodies 110 by using a cassette or the like.

[Mounting Step]

Figure 8:
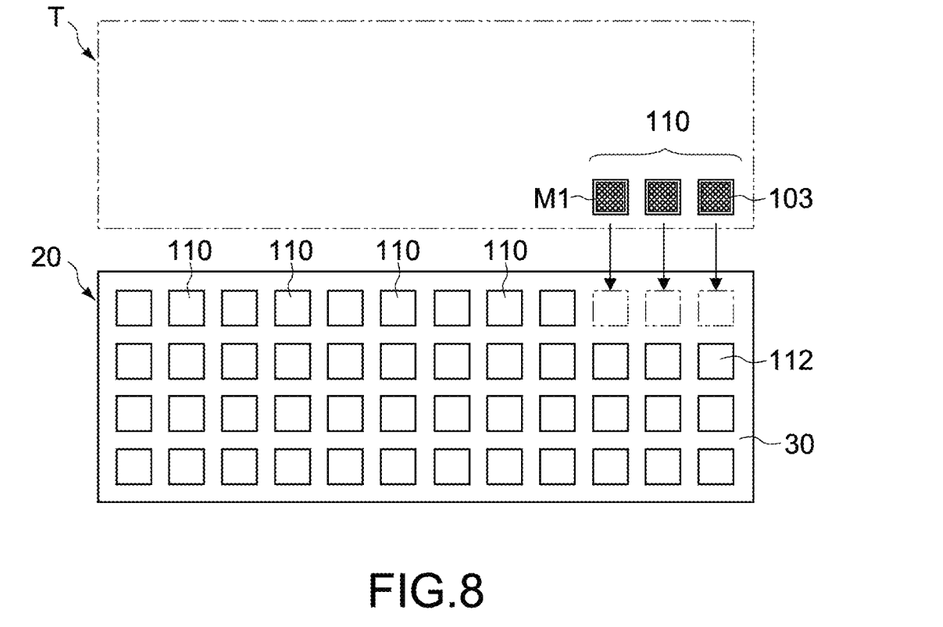
FIG. 8 A plan view schematically showing the holder used in the mounting step.
Figure 9:
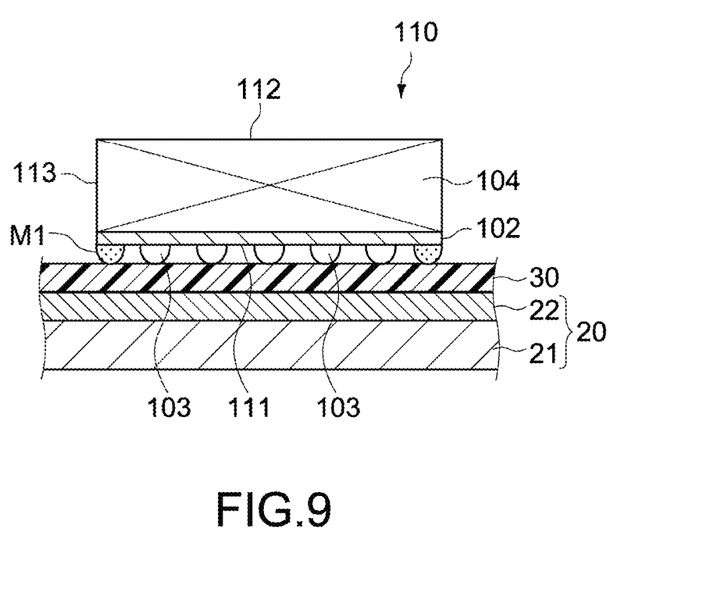
FIG. 9 A side cross-sectional view schematically showing a fundamental part of the holder for illustrating the structure thereof and illustrating how the component main-body is mounted.

FIG. 8 is a plan view schematically showing the holder 20 used in the mounting step. FIG. 9 is a side cross-sectional view schematically showing a fundamental part of the holder 20 for illustrating the structure thereof and illustrating how the component main-body 110 is mounted.

The holder 20 is used to hold the component main-bodies 110. As shown in FIG. 8, the holder 20 has an approximately rectangular flat-plate shape, on which the plurality of component main-bodies 110 can be mounted. As shown in FIG. 9, the holder 20 includes the holder main-body 21 made of a metal material such as aluminum and stainless steel, and the heat-conductive sheet 22 layered on the front surface of the holder main-body 21. Note that the holder 20 may not include the heat-conductive sheet 22. Further, the adhesive sheet 30 (adhesive layer), which is capable of adhesively holding the component main-body 110, is adhesively attached to the front surface of the holder 20 (front surface of the heat-conductive sheet 22).

The adhesive sheet 30 is, for example, a double-sided adhesive tape, and bonds the component main-body 110 and the heat-conductive sheet 22. The thickness of the adhesive sheet 30 is not particularly limited and, for example, 20 μm to 200 μm. If the adhesive sheet 30 is too thin, it is difficult for the adhesive sheet 30 to have a sufficient adhesive holding force for adhesively holding the component main-body 110. Note that the sufficient adhesive holding force means, for example, a force such that the component main-body 110 does not drop off from the adhesive sheet 30 where the holder 20 is upside down or predetermined acceleration or more is applied to the holder 20.

Meanwhile, if the adhesive sheet 30 is too thick, elasticity of the adhesive sheet 30 in the thickness direction is increased. As a result, when mounting, the component main-body 110 is likely to be buried into the adhesive sheet 30. Therefore, preferably, the adhesive sheet 30 has thickness such that the adhesive sheet 30 has the sufficient adhesive holding force for holding the component main-body 110 and, at the same time, the component main-body 110 may not be buried into the adhesive sheet 30 with its weight.

The adhesive sheet 30 has a lamination structure including, for example, a base material made of a resin material such as polyimide and PET (polyethylene terephthalate), and adhesive layers made of acrylic resin, silicone-series resin, or the like on the both sides of the base material. Alternatively, the adhesive sheet 30 may be a single-layer adhesive resin material.

In the present embodiment, the adhesive sheet 30 is peelable from the holder 20. Specifically, the adhesive sheet 30 is made of a heat-peelable adhesive agent, which maintains a predetermined adhesive force under a room temperature and whose adhesive force is lowered when it is heated at a predetermined temperature (for example, 120° C.). Instead, another adhesive agent, whose adhesive force is lowered when it is irradiated with ultraviolet, for example, may be used as the adhesive sheet 30. Alternatively, a peelable sheet (not shown) being an interface may be attached between the holder 20 and the adhesive sheet 30 in order to increase peelability from the holder 20.

In the mounting step (ST03), the mask section M1 of the bottom surface 111 of the component main-body 110 is bonded to the adhesive sheet 30 of the holder 20.

In the present embodiment, the four-cornered annular mask section M1 formed on the bottom surface 111 of the component main-body 110 has about the height equal to or more than the height of the bumps 103, and surrounds the bump-formed region R1. Therefore, as shown in FIG. 9, the component main-body 110 is bonded to the adhesive sheet 30 without a clearance between the component main-body 110 and the adhesive sheet 30. Therefore the mask section M1 shields the plurality of bumps 103 from the environment around the component main-body 110. At this time, the bumps 103 may be or may not be in contact with the adhesive sheet 30.

Further, since the mask section M1 having the above-mentioned structure is provided on the bottom surface 111 of the component main-body 110, the bottom surface 111 is in contact with the adhesive sheet 30 as follows. If the bottom surface 111 only has the bumps 103, the bumps 103 are in point-contact with the adhesive sheet 30. However, since the bottom surface 111 also has the mask section M1, not only the bumps 103 are in point-contact with the adhesive sheet 30, but also the mask section M1 is in line-contact with the adhesive sheet 30. Therefore, the component main-body 110 is not buried into the adhesive sheet 30, and the component main-body 110 is bonded to the adhesive sheet 30, the flatness being high and the contact area being sufficient. Therefore, the adhesive sheet 30 on the holder 20 holds the component main-body 110, the horizontal posture being maintained and the adhesive force being sufficient.

The mount unit 12 of the processing system 10 executes the mounting step. As shown in FIG. 8, the mount unit 12 mounts the component main-bodies 110, which were on the tray T, on the holder 20. At this time, the posture of the component main-body 110, in which the bottom surface 111 having the bumps 103 and the mask section M1 is the upside, is changed. When the component main-body 110 is mounted on the holder 20, the bottom surface 111 is the downside and faces the adhesive sheet 30 (the top surface 112 is the upside).

In FIG. 2, the solid arrows show the flow of the component main-bodies 110, and the double-dotted chain arrows show the flow of the holder 20. As shown in FIG. 2, the tray T, which supports the plurality of component main-bodies 110 having the mask sections M1 formed by the mask forming unit 11, and the holder 20, which has the adhesive sheet 30 adhesively attached on the front surface, are supplied to the mount unit 12. The mount unit 12 includes a mounter, which mounts the component main-bodies 110 one by one or the plurality of component main-bodies 110 simultaneously from the tray T on the holder 20.

As shown in FIG. 8, the plurality of component main-bodies 110 are mounted on the holder 20. The number of the mounted component main-bodies 110 is not particularly limited. For example, several tens to several hundreds of component main-bodies are mounted. The plurality of component main-bodies 110 adhesively held by the holder 20 are conveyed from the mounter unit 12 to the film-forming unit 13. A belt conveyer using a robot and the like may automatically convey the holder 20, or a worker may carry the holder 20 by using a cassette or the like (the same applies to conveyance between the following steps).

[Film-Forming Step]

The film-forming unit 13 of the processing system 10 executes the film-forming step (ST04). The film-forming unit 13 includes a film-forming apparatus for forming the protective film 105 on the top surface 112 and side peripheral surfaces 113 of the component main-body 110.

Figure 10:
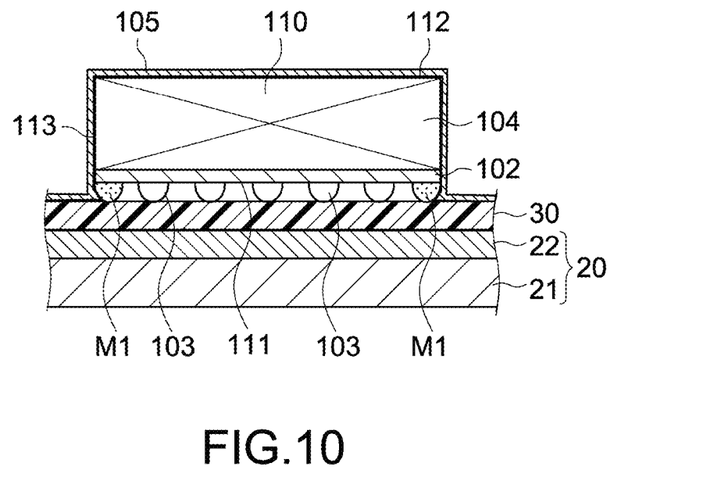
FIG. 10 A side-cross-sectional view schematically showing a fundamental part of the holder for illustrating how to form the protective film on the component main-bodies on the holder.

In the film-forming step, the holder 20 is mounted on a film-forming apparatus. Then the protective film 105 is formed on the top surface 112 and the side peripheral surfaces 113 of each component main-body 110. FIG. 10 is a side-cross-sectional view schematically showing a fundamental part of the holder for illustrating how to form the protective film 105 on the component main-body 110 on the holder 20.

As shown in FIG. 9, the protective film 105 is formed on the entire top surface 112 and the entire side peripheral surfaces 113 of the component main-body 110. The thickness of the protective film 105 is not particularly limited, and is 5 µm to 7 µm, for example. The material of the protective film 105 is not particularly limited. Typically, the protective film 105 is made of aluminum, titanium, chromium, copper, zinc, molybdenum, nickel, tungsten, tantalum, and oxide of them, nitride of them, or the like.

At this time, the mask section M1 comes between the bottom surface 111 of each component main-body 110 and the adhesive sheet 30, and thereby plays a role of shielding the plurality of bumps 103 from the environment around the component main-body 110. As a result, it is possible to, when forming a film, inhibit a film-material from coming in contact with the bottom surface 111 of the component main-body 110 and thus inhibit the film-material from adhering to the bumps 103 effectively.

Further, the mask section M1 holds the component main-body 110 on the front surface of the adhesive sheet 30, and the component main-body 110 is not buried into the adhesive sheet 30. Therefore, the lowermost portions of the side peripheral surfaces 113 are kept apart from the front surface of the adhesive sheet 30. As a result, the protective film 105 is formed not only the lowermost portions of the side peripheral surfaces 113 but also the outer surfaces of the mask section M1.

Figure 11A:
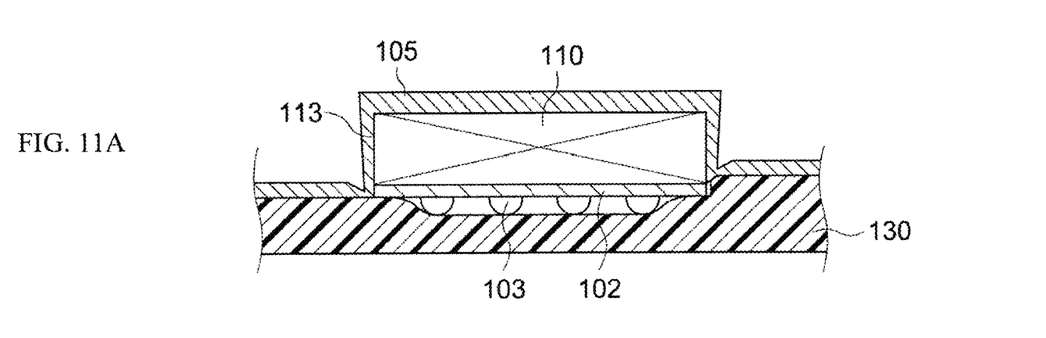
FIGS. 11A and 11B Side cross-sectional views each schematically showing a fundamental part of an electronic component for illustrating a method of manufacturing an electronic component of a comparative example.
Figure 11B:
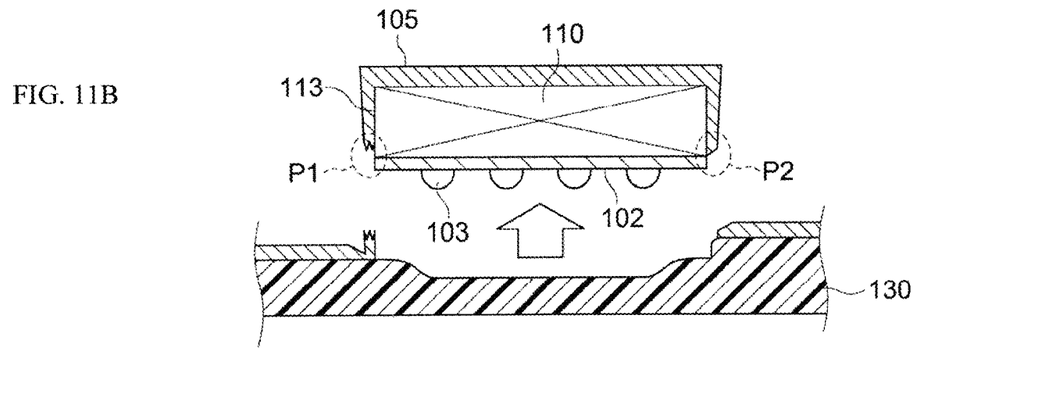

However, in a method of forming a protective film on the front surface of the component main-body 110 without forming the mask section M1, in order to secure the adhesive holding force of adhesively holding the component main-body 110, for example, as shown in FIG. 11A, it is necessary to use the high-cushioned adhesive sheet 130, which is easily deformed when it is pressed by the bumps 103 and can be bonded to the bottom surface portion 111 of the component main-body 110. In this case, as shown in FIG. 11A, the lowermost portions of the side peripheral surfaces 113 of the component main-body 110 may be in contact with the front surface of the adhesive sheet 130, or a part of the wiring board 102 may be buried into the adhesive sheet 130. If a film is formed in this case, then, as shown in FIG. 11A, the protective film 105 is formed over the contact portion in which the lowermost portions of the side peripheral surfaces 113 are in contact with the adhesive sheet 130. As a result, when the component main-body 110 is detached from the adhesive sheet 130 after forming the film, the protective film 105 is divided at the contact portion in which the lowermost portions of the side peripheral surfaces 113 are in contact with the adhesive sheet 130. Therefore, the protective film 105 covering the lowermost portions of the side peripheral surfaces 113 may be peeled off (see the portion P1 of FIG. 11B), or the film may not be formed on a part of the lowermost portions of the side peripheral surfaces 113 (see the portion P2 of FIG. 11B). It means that the protective film 105 is not formed well.

Figure 12:
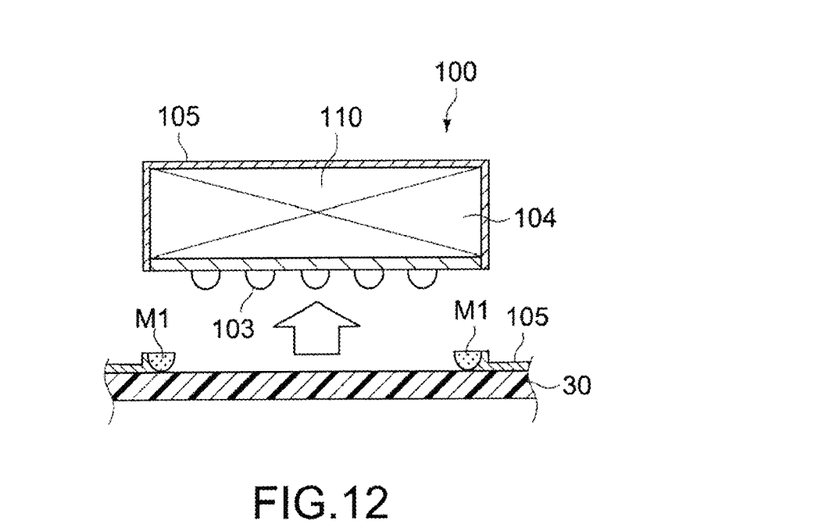
FIG. 12 A side cross-sectional view schematically showing a fundamental part of a component main-body for illustrating the step of collecting the component main-body.

To the contrary, according to the present embodiment, the mask section M1 is formed on the bottom surface 111 of the component main-body 110. Therefore, as described above, the protective film 105 is formed on not only the lowermost portions of the side peripheral surfaces 113 but also the outer surfaces of the mask section M1. As a result, in the following step of collecting components (ST05), when detaching the component main-body 110 from the adhesive sheet 30, as shown in FIG. 12, the protective film 105 is divided from the contact portion in which the bottom surface 111 of the component main-body 110 is in contact with the mask section M1. As a result, the protective film 105 covering the lowermost portions of the side peripheral surfaces 113 may not be peeled off, and the film may be completely formed on the lowermost portions of the side peripheral surfaces 113. The protective film 105 can cover the entire side peripheral surfaces 113.

As the above-mentioned film-forming apparatus, typically, a sputtering apparatus or a vapor deposition apparatus is used. As the film-forming apparatus, a batch film-forming apparatus is preferably used, which is capable of accommodating the plurality of holders 20 each holding the plurality of component main-bodies 110. Further, the film-forming apparatus is preferably configured to be capable of moving (rotating, swinging, etc.) each holder 20 relative to film-forming sources such as sputtering cathodes in a film-forming chamber, in order to appropriately form the protective film 105 on the surfaces (the top surface 112 and the side peripheral surfaces 113) of each of all the component main-bodies 110 on each holder 20. As such a film-forming apparatus, for example, a carousel sputtering apparatus is applicable.

The film-forming apparatus includes a support body that supports the holders 20 such as a stage and a rotary drum. Typically, the support body includes a cooling mechanism in which a cooling medium can circulate. The support body is configured to be capable of cooling down film-formed objects that the support body supports at a predetermined temperature or lower in order to protect the film-formed objects from heat from plasma and a vaporization source. In the present embodiment, the holder main-body 21 supports the component main-bodies 110 being film-formed objects, the adhesive sheet 30 and the heat-conductive sheet 22 being inserted therebetween. Therefore, the component main-bodies 110 are protected from heat from plasma and the like. Meanwhile, the adhesive force of the adhesive sheet 30 is inhibited from being lowered affected by heat.

After forming the protective film 105, each holder 20 is conveyed from the film-forming unit 13 to the heater unit 14.

[Step of Collecting Components]

In the step of collecting components (ST05), the plurality of component main-bodies 110, on which the films are formed, are extracted from each holder 20. The heater unit 14 and the component extracting unit 15 of the processing system 10 execute the step of collecting components.

The heater unit 14 includes a heating oven, which is capable of accommodating the holders 20 holding the plurality of component main-bodies 110 on which the films are formed, and capable of heating the holders 20 at a predetermined temperature (for example, 150° C.). The heater unit 14 executes the step of heating the holders 20 in order to lower the adhesive force of the adhesive sheet 30 by heating the adhesive sheet 30 at the predetermined temperature. The above-mentioned predetermined temperature is set appropriately depending on the kind of the heat-peelable adhesive agent of the adhesive sheet 30.

After the heater unit 14 executes the heating process for a predetermined time period at a predetermined temperature, the holders 20 are conveyed to the component extracting unit 15. A belt conveyer using a robot and the like may automatically convey each holder 20, or a worker may carry each holder 20 by using a cassette or the like.

The component extracting unit 15 peels the adhesive sheet 30 from the holder 20 (the heat-conductive sheet 22). Since the adhesive force of the adhesive sheet 30 is lowered after the heater unit 14 heats the adhesive sheet 30, the adhesive sheet 30 is detached from the holder 20 easily. Note that the adhesive sheet 30 may be peeled off before the holder 20 is conveyed to the component extracting unit 15.

Figure 13:
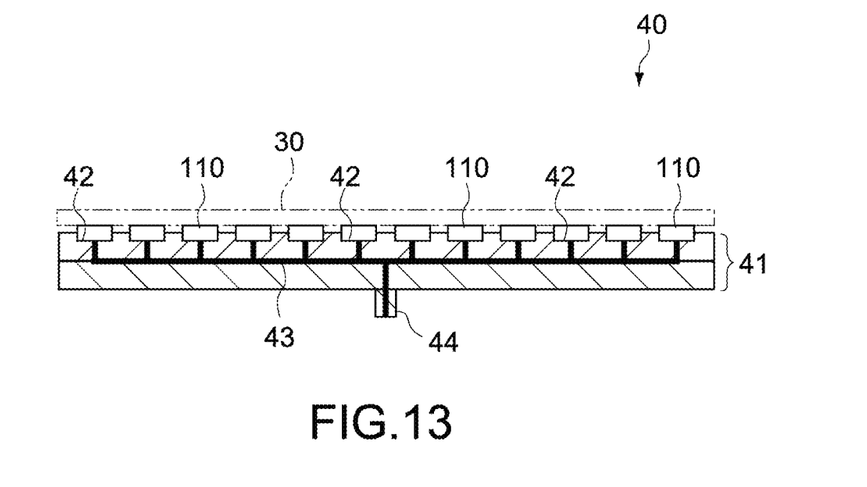
FIG. 13 A side cross-sectional view schematically illustrating the structure of a jig used to detach the component main-bodies from the adhesive sheet.

Next, the component extracting unit 15 extracts the plurality of component main-bodies 110 from the adhesive sheet 30. For example, the jig 40 of FIG. 13 is used to detach the component main-bodies 110 from the adhesive sheet 30. FIG. 13 is a side cross-sectional view schematically showing the structure of the jig 40.

As shown in FIG. 13, the jig 40 includes the plate-like jig main-body 41, the plurality of component catch portions 42 on the front surface of the jig main-body 41, and the communication path 43, which is inside the jig main-body 31 and communicates between the component catch portions 42 and the suction opening 43. The number, positions, shapes, and the like of the plurality of component catch portions 42 correspond to the number, positions, shapes, and the like of the plurality of component main-bodies 110 on the adhesive sheet 30. Therefore, where the adhesive sheet 130 is placed upside down, the component catch portions 42 can accommodate the plurality of component main-bodies 110 on the adhesive sheet 130, respectively. Then, air in the communication path 43 is released from the suction opening 43 by using a suction pump (vacuum pump) (not shown). As a result, the component catch portions 42 absorb and hold the component main-bodies 110. Under this status, the adhesive sheet 30 is peeled off from the component main-bodies 110 (see FIG. 12). The mask sections M1, which are still bonded to the adhesive sheet 30, are removed from the component main-bodies 110.

Note that, if the mask sections M1 are peeled off from the adhesive sheet 30 together with the component main-bodies 110, for example, adhesive tape strips (not shown) are attached on the bottom surfaces 111 of the component main-bodies 110 on the jig 40, then the adhesive tape strips are peeled again, and thereby the mask sections M1 can be peeled off and removed from the component main-bodies 110.

In this manner, the electronic component 100 is manufactured, in which the protective film 105 is formed on the surfaces (the top surface 112 and the side peripheral surfaces 113) of the component main-body 110. After that, the force of absorbing and holding the electronic components 100 on the jig 40 is released. Then, the electronic components 100 on the jig main-body 40 are mounted on a tray (not shown), and the electronic components 100 on each tray are collected.

[Step of Replacing Adhesive Layer]

Meanwhile, after the heating step, the holder 20, from which the adhesive sheet 30 is peeled off, is conveyed to the adhesive layer replacing unit 16 of the processing system 10.

The adhesive layer replacing unit 16 cleans the front surface of the heat-conductive sheet 22 of the holder 20 as necessary, and then adhesively attaches the new adhesive sheet 30 on the front surface of the heat-conductive sheet 22. Then, the holder 20 is conveyed again from the adhesive layer replacing unit 16 to the mount unit 12. As a result, it is possible to manufacture the electronic components 100 by using the common holder 20 and, at the same time, keep the adhesive holding force of adhesively holding the component main-bodies 110 constant.

Second Embodiment

Figure 14:
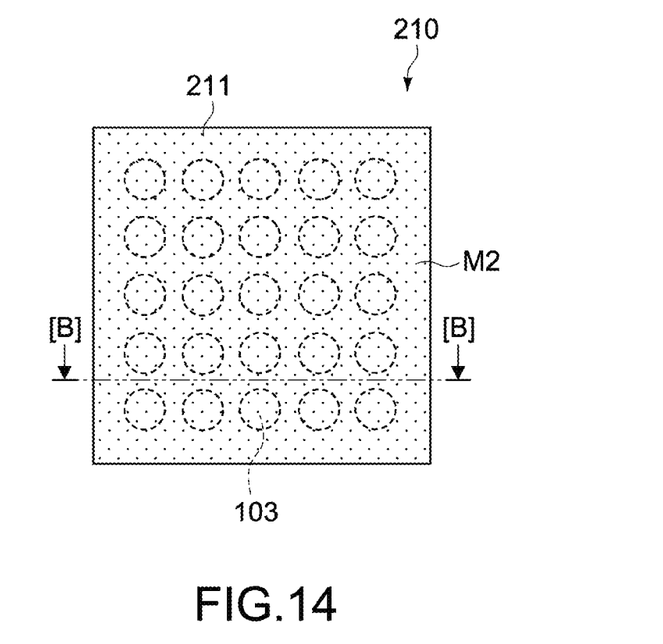
FIG. 14 A bottom view showing the component main-body for illustrating the structure of the mask section of the second embodiment of the present invention.
Figure 15:
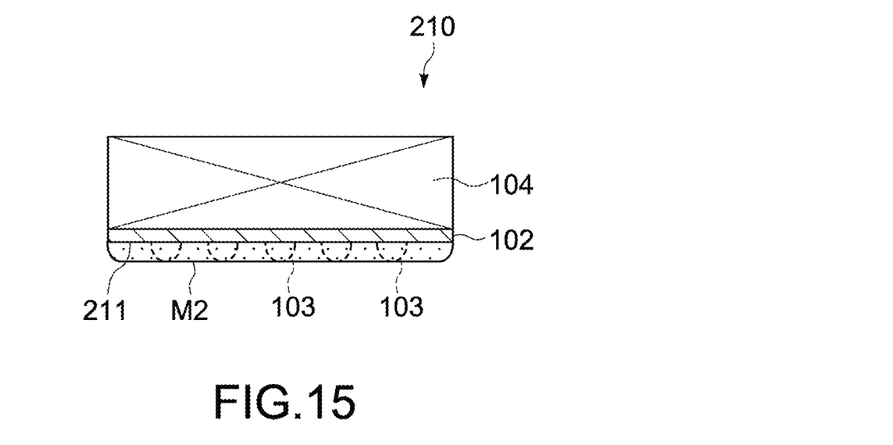
FIG. 15 A side cross-sectional view of the same.

FIG. 14 and FIG. 15 are diagrams for illustrating a method of manufacturing an electronic component according to a second embodiment of the present invention, and are a bottom view and a side cross-sectional view each showing a component main-body for illustrating the step of forming a mask section.

Hereinafter, the structures different from the structures of the first embodiment will mainly be described, and the structures similar to the structures of the first embodiment will be denoted by similar reference signs and description thereof will be omitted or simplified.

In the present embodiment, a mask section is formed on the bottom surface 211 of the component main-body 210 and surrounds an electrode-formed region. This is common to the structure of the first embodiment. However, the mode of the mask section is different from that of the first embodiment.

In other words, in the present embodiment, an insulative material is coated on not only the peripheral portion of the bottom surface 211 but also the electrode-formed region. As a result, the mask section M2, which has a mode like a protective layer spatially surrounding the plurality of bumps 103, is formed. Similar to the first embodiment, the formed mask section M2 has about the height equal to or more than the height of the plurality of bumps 103.

The method of forming the mask section M2 is not particularly limited. Similar to the first embodiment, the coating method using a dispenser nozzle/dispenser nozzles is applicable. Alternatively, various printing methods such as a screen printing method and a transferring method are applicable.

According to the present embodiment, similar to the above-mentioned first embodiment, it is possible to inhibit the film from adhering to the bumps 103 and, at the same time, appropriately form the protective film on the entire side peripheral surfaces of the component main-body 210. Especially, according to the present embodiment, since the mask section M2 is formed on the entire bottom surface 211 of the component main-body 210, the mask section M2 covers the plurality of bumps 103. As a result, the bottom surface 211 is flat. Therefore adherence to the adhesive sheet 30 on the holder 20 is increased, and the adhesive holding force of adhesively holding the component main-body 210 is increased.

Third Embodiment

Figure 16:
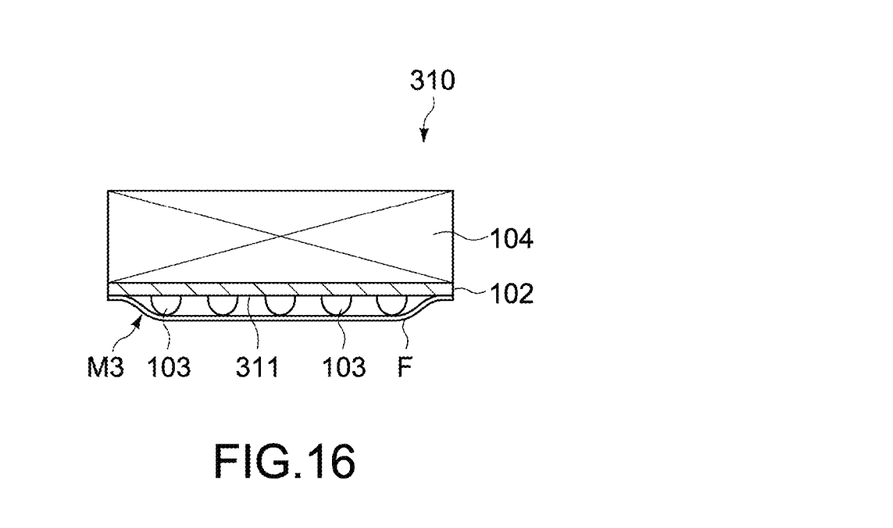
FIG. 16 A bottom view showing the component main-body for illustrating the structure of the mask section of the third embodiment of the present invention.

FIG. 16 is a diagram for illustrating a method of manufacturing an electronic component according to a second embodiment of the present invention, and is a side cross-sectional view each showing a component main-body for illustrating the step of forming a mask section.

Hereinafter, the structures different from the structures of the first embodiment will mainly be described, and the structures similar to the structures of the first embodiment will be denoted by similar reference signs and description thereof will be omitted or simplified.

In the present embodiment, a mask section is formed on the bottom surface 311 of the component main-body 310 and surrounds an electrode-formed region. This is common to the structure of the first embodiment. However, the mode of the mask section is different from that of the first embodiment.

In other words, in the present embodiment, the peripheral portion of the deformable film material F for covering the electrode-formed region is bonded to the peripheral portion of the bottom surface 311 of the component main-body 310, and thereby the mask section M3 is formed. As a result, the mask section M3, which has a mode like a cover spatially surrounding the plurality of bumps 103 in the electrode-formed region, is formed. In this case, the height of the mask section M3 formed on the bottom surface 311 is larger than the height of the plurality of bumps 103.

The film material F being the mask section M3 is a rectangular film, and has about an area equal to or more than the area of the bottom surface 311 of the component main-body 310. The film material F is a plastic film having heat resistance made of polyimide, polytetrafluoroethylene, or the like. The thickness of the film material F is not particularly limited. For example, the film material F having the thickness of 20 μm to 50 μm is used.

Figure 17A:
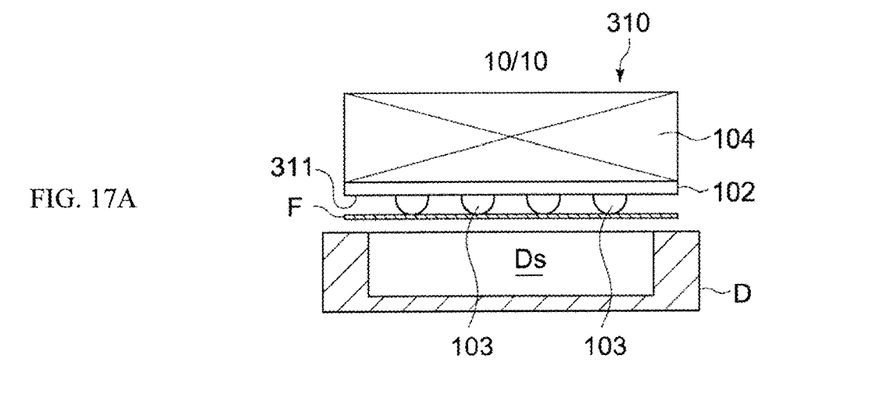
FIGS. 17A and 17B Diagrams schematically illustrating a method of forming the mask section.
Figure 17B:
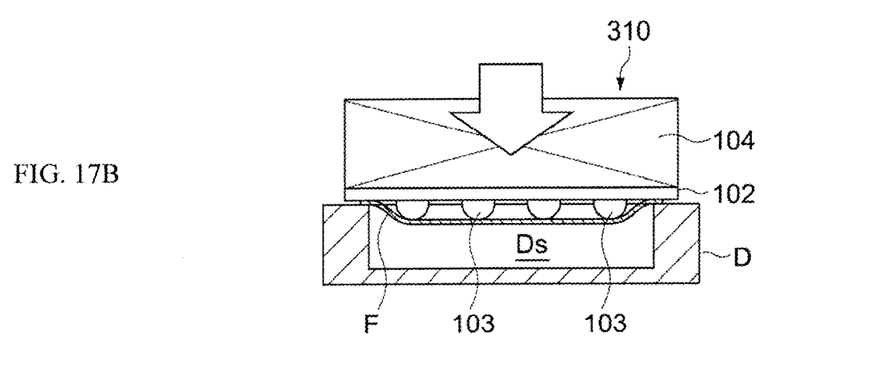

FIG. 17A schematically shows the frame D, which is, for example, used to form the mask section M3 by using the film material F. The frame D has the rectangular opening Ds formed on the top surface. The rectangular opening Ds is smaller than the bottom 311 (or the film material F) of the component main-body 310, and is capable of accommodating the plurality of bumps 103. The bottom surface 311 of the component main-body 310 is placed on the opening Ds, the film material F being between them. Then, as shown in FIG. 17B, the component main-body 310 is pressed against the top surface of the frame D.

Typically, adhesive bond is applied to the peripheral portion of the top surface of the film material F or the peripheral portion of the bottom surface 311 of the component main-body 310 in order to bond the film material F and the bottom surface 311. Then, when the component main-body 310 is pressed against the top surface of the frame D, the peripheral portion of the film material F is bonded to the peripheral portion of the bottom surface 311 of the component main-body 310. Typically, tension is applied to the film material F appropriately such that the surface of the film material F comes in contact with the tips of the bumps 103. Further, for example, cuts (slits) may be formed at the four corners of the film material in order to reduce wrinkles of the film material F when bonding the film material F.

According to the present embodiment, similar to the above-mentioned first embodiment, it is possible to inhibit the film from adhering to the bumps 103 and, at the same time, appropriately form the protective film on the entire side peripheral surfaces of the component main-body 310. Especially, according to the present embodiment, since the mask section M3 is formed on the entire bottom surface 311 of the component main-body 310, the mask section M3 covers the plurality of bumps 103. As a result, the bottom surface 311 is flat. Therefore adherence to the adhesive sheet 30 on the holder 20 is increased, and the adhesive holding force of adhesively holding the component main-body 310 is increased.

Embodiments of the present invention have been described above. As a matter of course, the present invention is not limited to the above-mentioned embodiments, but various modifications are applicable.

For example, in the embodiments, the mask section M1 to M3 is made of an insulative material. Not limited to this, the mask section M1 to M3 may be made of a conductive material such as a hardened metal paste and a metal film.

REFERENCE SIGNS LIST 10 processing system
11 mask forming unit
12 mount unit
13 film-forming unit
15 component extracting unit
16 adhesive layer replacing unit
20 holder
30 adhesive sheet
100 electronic component
103 bump
105 protective film
110, 210, 310 component main-body
M1 to M3 mask section

The invention claimed is:

1. A method of manufacturing an electronic component, comprising:
    preparing a component main-body including a first surface having an electrode-formed region having a plurality of bump electrodes, a second surface opposite to the first surface, and side peripheral surfaces connecting the first surface and the second surface;
    forming a mask section on at least a peripheral portion of the first surface, the mask section surrounding the electrode-formed region, a height of the mask section being equal to or more than a height of the plurality of bump electrodes;
    bonding the mask section of the first surface to an adhesive layer on a holder for holding a component;
    forming a protective film on the component main-body, the protective film covering the second surface, the side peripheral surfaces, and the adhesive layer; and
    removing the component main-body from the adhesive layer by dividing the protective film from a contact portion in which the first surface is in contact with the mask section.

2. The method of manufacturing an electronic component according to claim 1, wherein
    forming the mask section includes coating an insulative material on the peripheral portion of the first surface.

3. The method of manufacturing an electronic component according to claim 1, wherein
    forming the mask section includes coating an insulative material on the peripheral portion and the electrode-formed region of the first surface.

4. The method of manufacturing an electronic component according to claim 1, wherein
    forming the mask section includes bonding a peripheral portion of a deformable film material to the peripheral portion of the first surface, the deformable film material covering the electrode-formed region.

5. The method of manufacturing an electronic component according to claim 1, wherein
    forming the mask section includes coating a conductive material on the peripheral portion of the first surface.

6. The method of manufacturing an electronic component according to claim 1, wherein
    forming the mask section includes coating a conductive material on the peripheral portion and the electrode-formed region of the first surface.

7. The method of manufacturing an electronic component according to claim 1, wherein
    the component main-body includes a plurality of component main-bodies,
    the plurality of component main-bodies are bonded to the adhesive layer, and
    the protective films are formed on the plurality of component main-bodies, respectively, all at once.

8. The method of manufacturing an electronic component according to claim 1, further comprising:
    peeling the component main-body from the adhesive layer; and then
    replacing the adhesive layer on the holder.

* * * * *